United States Patent
Yang et al.

(10) Patent No.: US 10,682,924 B2
(45) Date of Patent: Jun. 16, 2020

(54) PILOT SIGNAL GENERATING AND ISOLATION CIRCUIT AND ELECTRIC VEHICLE SUPPLY EQUIPMENT INCLUDING THE SAME

(71) Applicant: EATON CORPORATION, Cleveland, OH (US)

(72) Inventors: Lin Yang, Shanghai (CN); Tom Xiong, Shanghai (CN); Kevin Zhong, Shanghai (CN); Chuanchuan Zhuang, Shanghai (CN); Xianzhen Zhang, Shanghai (CN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 427 days.

(21) Appl. No.: 15/827,146

(22) Filed: Nov. 30, 2017

(65) Prior Publication Data
US 2019/0160955 A1    May 30, 2019

(51) Int. Cl.
| | |
|---|---|
| *B60L 53/60* | (2019.01) |
| *G01R 15/14* | (2006.01) |
| *G08C 19/34* | (2006.01) |
| *G06F 1/26* | (2006.01) |
| *B60L 53/14* | (2019.01) |

(52) U.S. Cl.
CPC .............. *B60L 53/60* (2019.02); *B60L 53/14* (2019.02); *G01R 15/14* (2013.01); *G06F 1/263* (2013.01); *G08C 19/34* (2013.01)

(58) Field of Classification Search
CPC ...... B60L 53/60; B60L 53/14; B60L 11/1844; G01R 15/14; H02J 7/042

USPC .......................................................... 320/109
See application file for complete search history.

(56) References Cited

U.S. PATENT DOCUMENTS

| | | | | |
|---|---|---|---|---|
| 8,768,563 | B2 * | 7/2014 | Nitzberg | G07C 3/00 701/31.6 |
| 9,071,074 | B2 * | 6/2015 | Chen | B60L 53/16 |
| 9,112,373 | B2 * | 8/2015 | Ghabbour | B60L 3/003 |
| 9,368,008 | B2 * | 6/2016 | Jefferies | G08B 13/1418 |
| 9,573,478 | B2 * | 2/2017 | Jefferies | H02J 7/00 |
| 9,614,585 | B2 * | 4/2017 | Katar | B60L 3/0069 |
| 9,841,451 | B2 * | 12/2017 | Reid | B60L 50/66 |
| 2014/0015482 | A1 * | 1/2014 | Nitzberg | B60L 53/30 320/109 |
| 2014/0267712 | A1 * | 9/2014 | Foerster | G08B 13/1427 348/143 |

* cited by examiner

*Primary Examiner* — Richard V Muralidar
(74) *Attorney, Agent, or Firm* — Eckert Seamans Cherin & Mellott, LLC

(57) ABSTRACT

An electrical circuit for electric vehicle supply equipment, the electrical circuit including a pilot control signal unit structured to generate a pilot control signal having a state including one of a high state and a low state, an isolation unit electrically connected to the pilot control signal unit and a first ground and being structured to isolate the pilot control signal to generate an isolated pilot control signal, and an amplification unit electrically connected to the isolation unit, having a second ground, and being structured to amplify the isolated pilot control signal to generate a pilot signal. The isolation unit is structured to isolate the second ground of the amplification unit from the first ground.

20 Claims, 4 Drawing Sheets

PILOT SIGNAL GENERATING AND ISOLATION CIRCUIT AND ELECTRIC VEHICLE SUPPLY EQUIPMENT INCLUDING THE SAME

BACKGROUND

Field

The disclosed concept pertains generally to electric vehicle supply equipment and, more particularly, to a pilot signal generating circuit for electric vehicle supply equipment. The disclosed concept also relates to electric vehicle supply equipment.

Background Information

An electric vehicle (EV) charging station, also called an EV charging station, electric recharging point, charging point, and EVSE (Electric Vehicle Supply Equipment), is an element in an infrastructure that supplies electric energy for the recharging of electric vehicles, plug-in hybrid electric-gasoline vehicles, or semi-static and mobile electrical units such as exhibition stands.

An EV charging station is a device that safely allows electricity to flow. These charging stations and the protocols established to create them are known as EVSE, and they enhance safety by enabling two-way communication between the charging station and the electric vehicle.

The 1996 NEC and California Article 625 define EVSE as being the conductors, including the ungrounded, grounded, and equipment grounding conductors, the electric vehicle connectors, attachment plugs, and all other fittings, devices, power outlets or apparatus installed specifically for the purpose of delivering energy from premises wiring to an electric vehicle.

EVSE is defined by the Society of Automotive Engineers (SAE) recommended practice J1772 and the National Fire Protection Association (NFPA) National Electric Code (NEC) Article 625. While the NEC defines several safety requirements, J1772 defines the physical conductive connection type, five pin functions (i.e., two power pins (Hot1 and Hot2 or neutral; or L1 and L2), one ground pin 3, one control pilot pin 4, and one proximity pin 5), the EVSE to EV handshake over the pilot pin 4, and how both parts (EVSE and EV) are supposed to function. FIG. 1 is a block diagram in schematic form of a charging system 100 compliant with the J1772 standard.

Two-way communication seeks to ensure that the current passed to the EV is both below the limits of the EV charging station itself and below the limits of what the EV can receive. There are additional safety features, such as a safety lock-out that does not allow current to flow from the EV charging station until the EV connector or EV plug is physically inserted into the EV and the EV is ready to accept energy.

J1772 in North America and IEC 61851 standard use a very simple but effective pilot circuit and handshake in the EVSE. For charging a vehicle using alternating current (AC), the control electronics 22 generate a 12 Vdc pilot voltage. The 12 Vdc pilot voltage is provided to the pilot pin 4 of FIG. 1. When the EVSE cable and connector 10 is plugged into an EV inlet 11 of a compliant vehicle 12, the vehicle's circuit has a resistor 14 and a diode 16 in series that ties to ground 18 in order to drop the 12 Vdc to 9 Vdc. After the EVSE 20 sees this drop in voltage, it turns on a pulse-width modulated (PWM) generator in control electronics 22 that defines the maximum available line current (ALC) on the charging circuit. The vehicle charge controller 24 reads the percentage of the duty cycle of the PWM signal, which is equivalent to a certain amperage, and sets the maximum current draw on the onboard vehicle rectifier/charger 26, in order to not trip an upstream circuit interrupter (not shown). The vehicle 12, in turn, adds another resistor 28 in parallel with the resistor 14 of the vehicle's resistor and diode 14,16 series combination, which then drops the top level of the PWM pilot signal to 6 Vdc. This tells the EVSE 20 that the vehicle 12 is ready to charge. In response, the EVSE 20 closes an internal relay/contactor 30 to allow AC power to flow to the vehicle 12.

The contactor 30 includes a first set of contacts 32 and a second set of contacts 34. The EVSE 20 includes a first differential amplifier circuit 40 that is electrically connected to a line side output of the first set of contacts 32 via a first connection 44 and to a load side output of the first set of contacts 32 via a second connection 46. The EVSE 20 also includes a second differential amplifier circuit 42 that is electrically connected to a line side output of the second set of contacts 34 via a third connection 48 and to a load side output of the second set of contacts 34 via a fourth connection 50. The first differential amplifier circuit 40 amplifies a difference in voltage between the line side output and the load side output of the first set of contacts 32 and the second differential amplifier circuit 42 amplifies a difference in voltage between the line side output and the load side output of the second set of contacts 34 and outputs the amplified voltage differences to the control electronics 22.

The control electronics 22 determine, from the amplified voltage differences received from the first and second differential amplifier circuits 40,42, whether the first and/or second sets of contacts 32,34 are open or closed. For example, when there is little or no difference in the voltages between the line and load side outputs of one of the set of contacts 32,34, it is an indication that the set of contacts is closed.

One issue with the charging system 100 of FIG. 1 is that the control electronics 22 cannot withstand a 6 kV surge voltage. For example, the control electronics 22 includes a power supply that uses power from the power lines L1,L2 in the EVSE to generate DC power and ground for use by the control electronics 22 to perform its functions such as generating the pilot signal. The 6 kV surge voltage can damage the control electronics 22 and, if the 6 kV surge voltage affects the pilot signal, the surge voltage can travel through the control pilot pin 4 to the vehicle 12 and damage control equipment such as the charge controller 24 in the vehicle.

There is room for improvement in EVSE including, for example, circuitry for generating the pilot signal.

SUMMARY

These needs and others are met by embodiments of the disclosed concept in which a pilot signal generating circuit is capable of isolating the pilot signal in EVSE.

In accordance with one aspect of the disclosed concept, an electrical circuit for electric vehicle supply equipment, the electrical circuit comprises: a pilot control signal unit structured to generate a pilot control signal having a state including one of a high state and a low state; an isolation unit electrically connected to the pilot control signal unit and a first ground and being structured to isolate the pilot control signal to generate an isolated pilot control signal; and an amplification unit electrically connected to the isolation unit, having a second ground, and being structured to amplify the isolated pilot control signal to generate a pilot signal, wherein the isolation unit is structured to isolate the second ground of the amplification unit from the first ground.

In accordance with another aspect of the disclosed concept, electric vehicle supply equipment comprises: power lines structured to carry power to charge an electric vehicle; a power supply unit structured to generate DC power and a first ground from power received from the power lines; and a pilot signal generating circuit structured to generate a pilot signal and including: a pilot control signal unit structured to generate a pilot control signal having a state including one of a high state and a low state; an isolation unit electrically connected to the pilot control signal unit and the first ground and being structured to isolate the pilot control signal to generate an isolated pilot control signal; and an amplification unit electrically connected to the isolation unit, having a second ground, and being structured to amplify the isolated pilot control signal to generate the pilot signal, wherein the isolation unit is structured to isolate the second ground of the amplification unit from the first ground.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
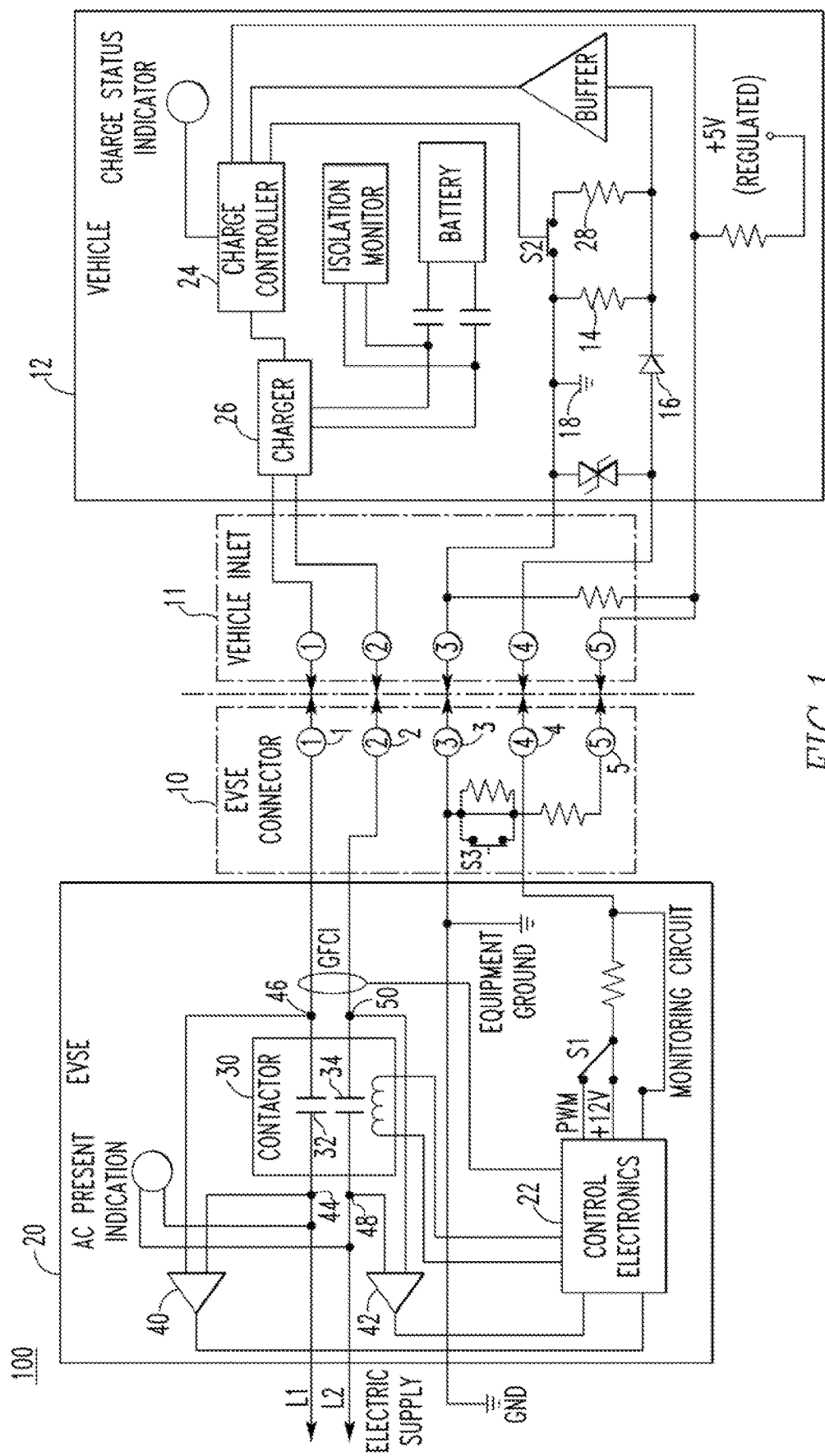
FIG. 1 is a block diagram in schematic form of an electric vehicle supply equipment (EVSE) to electric vehicle (EV) system.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "processor" shall mean a programmable analog and/or digital device that can store, retrieve, and process data; a microprocessor; a microcontroller; a microcomputer; a central processing unit; or any suitable processing device or apparatus.

As employed herein, the term "power lines of the electric vehicle supply equipment" or "power lines of the EVSE" shall mean the conductors in EVSE that carry the power that is used to charge an EV. For example, the conductors that carry the L1 and L2 power through the EVSE 100 to the EVSE connector 10 in FIG. 1 are the power lines of the EVSE 100.

Electric vehicle charging systems compliant with the J1772 standard use a pilot signal that can range in voltage between −12V and 12V. The pilot signal is a 1 kHz square wave having a duty cycle. J1772 provides for various statuses associated with the voltage of a pilot signal.

TABLE 1

| Base Status | Charging Status | Voltage |
| --- | --- | --- |
| Status A | Standby | +12 V |
| Status B | Vehicle Detected | +9 ± 1 V |
| Status C | Ready (charging) | +6 ± 1 V |
| Status D | With ventilation | +3 ± 1 V |
| Status E | No power (shut off) | 0 V |
| Status F | Error | −12 V |

For example, in the standby status (e.g., the EV connector is not plugged into an EV), the pilot signal will have a voltage of 12V. Once the EV connector is plugged into the EV, but is not charging the EV, the voltage of the pilot signal will change to 9±1V. Voltages of the pilot signal are also associated with statuses of with ventilation (i.e., the EV requests charging be done in a ventilated area), no power, and error, as shown in Table 1.

J1772 also provides for various charging capacities based on the duty cycle of the pilot signal.

TABLE 2

| PWM | SAE Continuous | SAE Short Term |
| --- | --- | --- |
| 50% | 30 A | 36 A peak |
| 40% | 24 A | 30 A peak |
| 30% | 18 A | 22 A peak |
| 25% | 15 A | 20 A peak |
| 16% | 9.6 A | |
| 10% | 6 A | |

For example, if the pilot signal has a duty cycle of 50%, it indicates that the EVSE is able to provide a maximum of a 30 A current to continuously charge the EV or to provide a 36 A peak current in the short term, as shown in Table 2.

Figure 2:
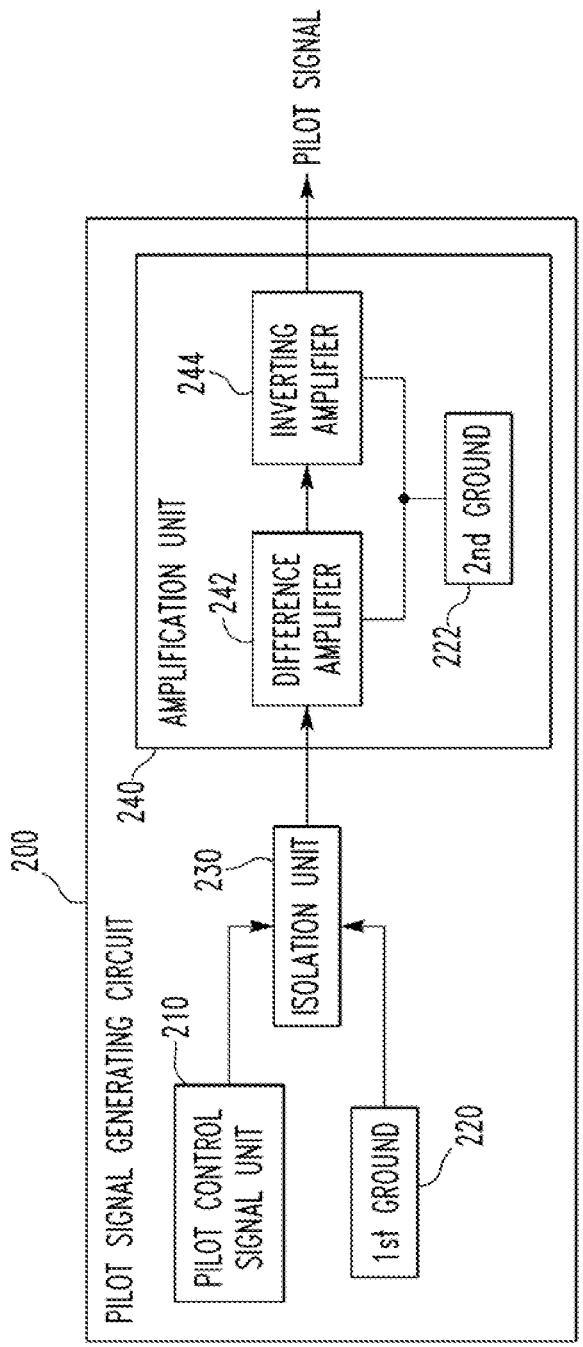
FIG. 2 is a block diagram in schematic form of a pilot signal generating circuit in accordance with an example embodiment of the disclosed concept.

FIG. 2 is a block diagram in schematic form of a pilot signal generating circuit 200 in accordance with an example embodiment of the disclosed concept. The pilot signal generating circuit 200 includes a pilot control signal unit 210, a first ground 220, an isolation unit 230, and an amplification unit 240. In some example embodiments of the disclosed concept, the amplification unit 240 may include a difference amplifier 242 and an inverting amplifier 244. The pilot signal generating circuit 200 may be employed in EVSE. For example, the pilot signal generating circuit 200 may be employed in control electronics 22' of EVSE 100' (see FIG. 4).

The pilot control signal unit 210 is structured to generate a pilot control signal. The pilot control signal is not isolated with respect to the power lines of EVSE. The power lines are the conductors that carry power to charge the EV. For example, referring to FIG. 4, the power lines of EVSE 100' are the conductors that carry the L1 and L2 power through the EVSE 100' to the EVSE connector 10. For example, the pilot control signal unit 210 may use power from a power supply of the EVSE to generate the pilot control signal. The power supply may use power from the power lines of the EVSE such power provided by the power supply is not isolated from the power lines of the EVSE and, thus, any signal generated using power from the power supply, such as the pilot control signal, is also not isolated from the power lines of the EVSE. For example, in FIG. 4 the EVSE 100' includes control electronics 22' that use a power supply 300 that is not isolated from the power lines of the EVSE 100'.

In some example embodiments of the disclosed concept, the pilot control signal may have an associated state and the pilot control signal unit 210 may control the state of the pilot control signal. For example and without limitation, the pilot control signal may have a "HIGH" and a "LOW" state. The states of the pilot control signal may have associated voltages. For example and without limitation, when the pilot control signal is in the "LOW" state, it may have a voltage of −12V, and when the pilot control signal is in the "HIGH" state, it may a voltage of 12V. However, it will be appreciated by those having ordinary skill in the art that any voltages may be associated with the states of the pilot control signal without departing from the scope of the disclosed concept.

The pilot control signal unit 210 may be formed of any electronic components capable of generating a voltage signal. For example and without limitation, in some example embodiments of the disclosed concept, the pilot control signal unit 210 may be a processor structured to output the pilot control signal and control the state of the pilot control signal.

The first ground 220 is also not isolated from the power lines of the EVSE. For example, the first ground 220 may be generated by the power supply 300 of the EVSE 100' of FIG. 4 and is not isolated from the power lines of the EVSE 100'.

The pilot control signal unit 210 and the first ground 220 are electrically connected to the isolation unit 230. The isolation unit 230 is structured to isolate the pilot control signal from the power lines of the EVSE to generate and output an isolated pilot control signal. For example, the isolation unit 230 is structured to isolate the pilot control signal from the power lines of the EVSE such that the equipment subsequent to the isolation unit 230 is protected from at least a 6 kV voltage surge between the power lines of the EVSE.

The amplification unit 240 uses a second ground 222. The isolation unit 230 is structured to isolate the first ground 220 from the second ground 222. For example, the isolation unit 230 is structured to isolate the first ground 220 from the second ground 222 such that the equipment subsequent to the isolation unit 230 is protected from at least a 6 kV voltage surge between power lines of the EVSE. The second ground 222 is used in equipment subsequent to the isolation unit 230. In some example embodiments, the first ground 220 is not isolated from the power lines of the EVSE. Since the second ground 222 is isolated from the power lines of the EVSE, the equipment that uses the second ground 222 is protected, whereas it would be at risk if it used the first ground 220.

The amplification unit 240 includes the difference amplifier 242 and the inverting amplifier 244 electrically connected in series. The difference amplifier 242 is structured to receive the isolated pilot control signal and to amplify a difference between the isolated pilot control signal and the second ground 222. The output of the difference amplifier is an inverted version of the pilot control signal. For example, if the pilot control signal is 12V, the output of the difference amplifier 242 will be −12V. The inverting amplifier 244 is structured to invert the output of the difference amplifier 242. The output of the inverting amplifier 244 is the pilot signal.

In some example embodiments of the disclosed concept, the pilot signal will have about the same voltage as the pilot control signal. For example, if the pilot control signal unit 210 generates a pilot control signal having a voltage of 12V, the pilot signal output from the inverting amplifier 244 with have a voltage of 12V. However, the pilot control signal and its associated first ground 220 are not isolated from the power lines of the EVSE while the pilot signal output by the inverting amplifier 244 and its associated second ground 222 are isolated from the power lines of the EVSE. In some example embodiments of the disclosed concept, when the pilot control signal has the HIGH state, the pilot signal has a voltage of 12V and when the pilot control signal has the LOW state, the pilot signal has a voltage of −12V. The pilot control signal may also have a number of intermediate states between the HIGH and LOW states without departing from the scope of the disclosed concept. In some example embodiments of the disclosed concept, the pilot signal output from the amplification unit 240 is a J1772 compliant pilot signal.

In some example embodiments of the disclosed concept, the pilot control signal and the pilot signal may have different voltages. The pilot signal may have a voltage that is a multiple of the pilot control signal. For example, when the pilot control signal has a voltage of 3V, the pilot signal will have a voltage that is 12V, which is 4 times the voltage of the pilot control signal. Other multiples may be used without departing from the scope of the disclosed concept. The gains of the difference amplifier 242 and/or the inverting amplifier 244 may be adjusted to provide the gain needed to reach the voltage of the pilot signal.

Figure 3:
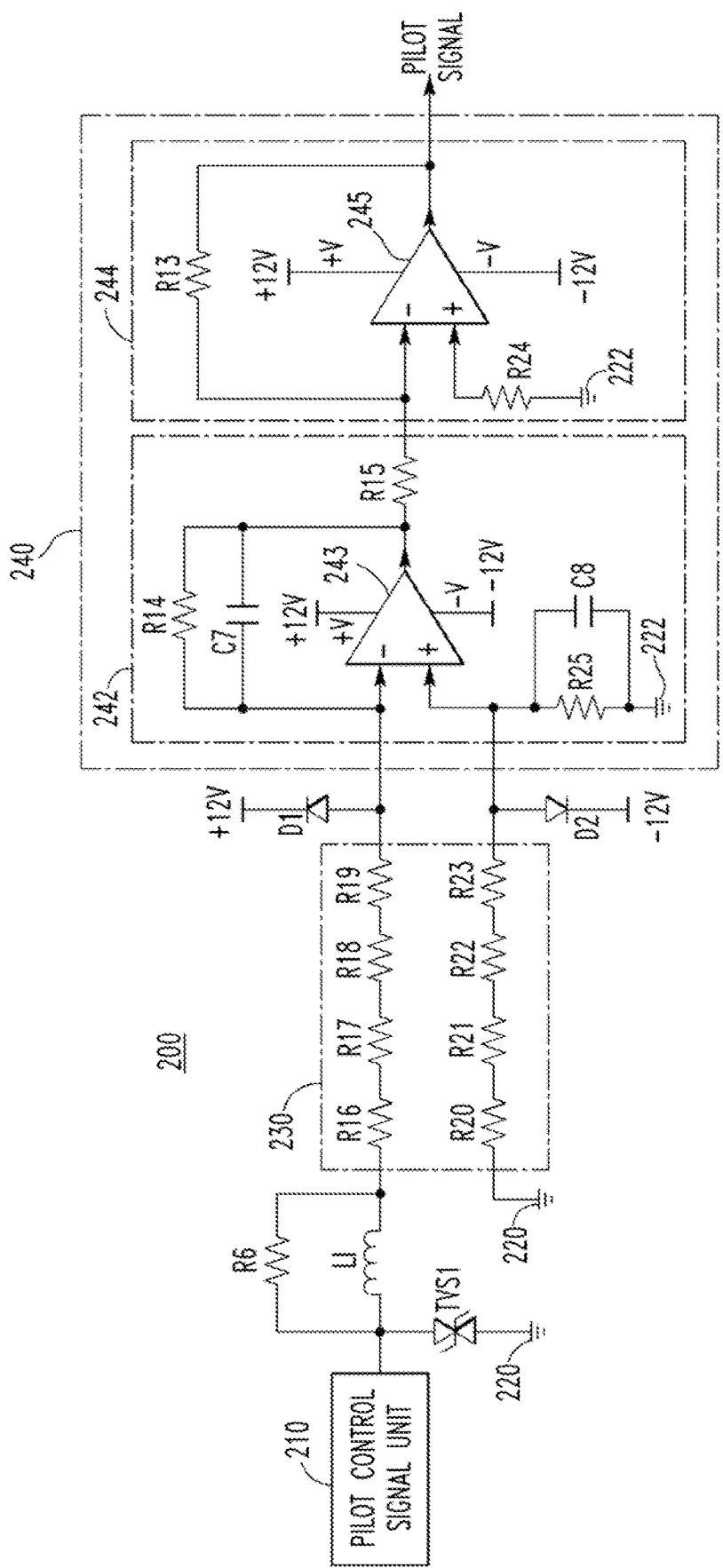
FIG. 3 is a circuit diagram of a pilot signal generating circuit in accordance with an example embodiment of the disclosed concept.

FIG. 3 is a circuit diagram of the pilot signal generating unit 200 in accordance with an example embodiment of the disclosed concept. As previously described, the pilot control signal unit 210 is structured to generate the pilot control signal. The output of the pilot control signal unit 210, which outputs the pilot control signal, is coupled to the isolation unit 230. Intermediate components may be provided between the pilot control signal unit 210 and the isolation unit 230 without departing from the scope of the disclosed concept. For example, conditioning circuitry including inductor L1, resistor R6, and transient voltage suppression diode (TVS1) are connected between the pilot control signal unit 210 and the isolation unit 230. The conditioning circuitry provides conditioning and protection.

The isolation unit 230 is electrically coupled on one side to the pilot control signal unit 210 and the first ground 222 and is electrically coupled on another side to the amplification unit 240. The isolation unit 230 includes a first plurality of resistors R16,R17,R18,R19 electrically connected in series between the pilot control signal unit 210 and the amplification unit 240. The isolation unit 230 also includes a second plurality of resistors R20,R21,R22,R23 electrically connected in series between the first ground 220 and the amplification unit 240.

The first and second pluralities of resistors R16,R17,R18, R19,R20,R21,R22,R23 are high impedance resistors. In some example embodiments of the disclosed concept, each of the first plurality of resistors R16,R17,R18,R19 have a resistance of at least 1 MΩ and each of the second plurality of resistors R20,R21,R22,R23 have a resistance of at least 1 MΩ. In some example embodiments of the disclosed concept, the series connection of the first plurality of resistors R16,R17,R18,R19 has a total resistance of at least 4 MΩ and the series connection of the second plurality of resistors R20,R21,R22,R23 has a total resistance of at least 4 MΩ. The high impedance of the first plurality of resistors R16, R17,R18,R19 isolates the pilot control signal from power lines of the EVSE. The high impedance of the second plurality of resistors R20,R21,R22,R23 isolates subsequent components from the first ground 220.

The pilot control signal passes through the first plurality of resistors R16,R17,R18,R19. The output from the first plurality of resistors R16,R17,R18,R19 is an isolated pilot control signal.

In some example embodiments, diodes D1 and D2 are electrically coupled between outputs of the isolation unit 230 and a supply voltage. Diodes D1 and D2 in conjunction with the supply voltage limit the voltage input to the amplification unit 240 to the level of the supply voltage, thus providing protection to the input of the amplification unit 240.

The amplification unit 240 unit is structured to receive the isolated pilot control signal. The amplification unit 240 is also isolated from the first ground 220 by the second plurality of resistors R20,R21,R22,R23. The amplification unit 240 uses the second ground 222, which is isolated from the power lines of the EVSE.

The amplification unit 240 includes the difference amplifier 242. In the example embodiment shown in FIG. 3, the difference amplifier 242 includes a first operational amplifier 243 having a non-inverting input, an inverting input, and an output. The inverting input is structured to receive the isolated pilot control signal. The isolation unit 230 is electrically connected between the first ground 220 and the non-inverting input. The second ground 222 is electrically coupled to the non-inverting input. The difference amplifier additionally includes resistor 25 and capacitor C8 electrically connected in parallel with each other between the second ground 222 and the non-inverting input. The difference amplifier 242 further includes resistor R14 and capacitor C7 electrically connected in parallel with each other between the inverting input and the output of the operational amplifier 243. Resistor R15 may also be electrically coupled to the output of the operational amplifier 243. The output of the difference amplifier 242 is an inverted version of the isolated pilot control signal. In some example embodiments of the disclosed concept, the difference amplifier 242 may have a gain that scales the isolated pilot control signal in addition to inverting it.

FIG. 3 shows one example of the difference amplifier 242. It will be appreciated by those having ordinary skill in the art that other components and arrangements of components may be employed as the difference amplifier 242 without departing from the scope of the disclosed concept.

The inverting amplifier 244 is structured to receive the output of the difference amplifier 242. The inverting amplifier 244 includes a second operational amplifier 245 having a non-inverting input, an inverting input, and an output. The inverting input of the second operational amplifier 245 is structured to receive the output of the difference amplifier 242. The non-inverting input of the second operational amplifier 245 is electrically coupled to the second ground 222. The pilot signal is output from the output of the second operational amplifier 245. Resistor R24 may be electrically connected between the non-inverting input of the second operational amplifier 245 and the second ground 222. Resistor R13 may be electrically connected between the inverting input and the output of the second operational amplifier 245. The output of the inverting amplifier 244 is an inverted version of the output of the difference amplifier 242. In some example embodiments of the disclosed concept, the inverting amplifier 244 may have a gain that scales the output of the difference amplifier 242 in addition to inverting it.

FIG. 3 shows one example of the inverting amplifier 244. It will be appreciated by those having ordinary skill in the art that other components and arrangements of components may be employed as the inverting amplifier 244 without departing from the scope of the disclosed concept.

Figure 4:
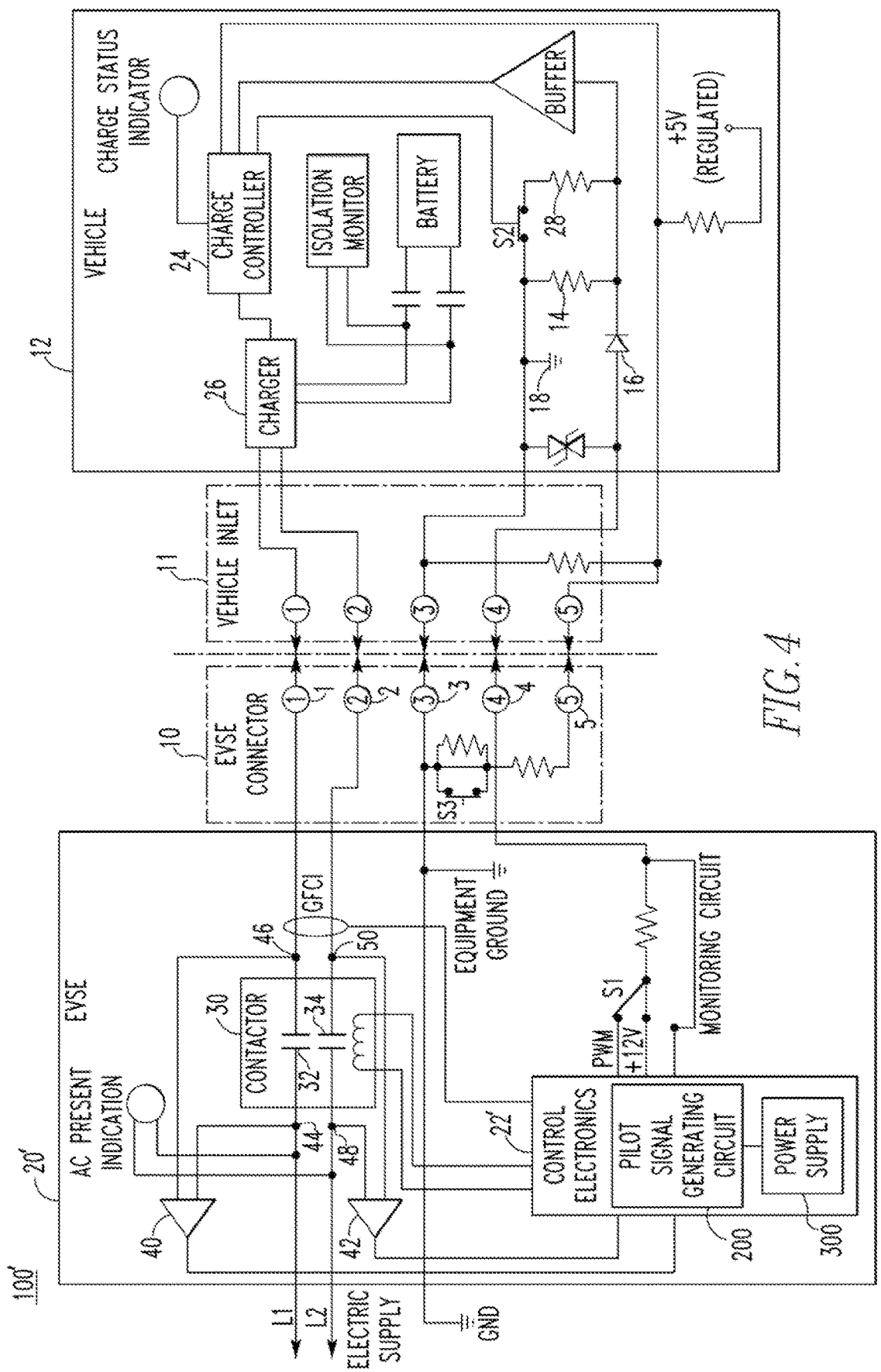
FIG. 4 is a block diagram in schematic form of an EVSE to EV system including a pilot signal generating circuit in accordance with an example embodiment of the disclosed concept.

Referring to FIG. 4, an EVSE to EV system 100' in accordance with an example embodiment of the disclosed concept is shown. The EVSE to EV system 100' of FIG. 4 is similar to the EVSE to EV system 100 of FIG. 1. However, the EVSE to EV system 100' of FIG. 4 employs the pilot signal generating circuit 200 in accordance with example embodiments of the disclosed concept. A power supply 300 is also shown in FIG. 4. The power supply 300 is structured to generate DC power from power received from the power lines L1,L2 of the EVSE 100'. The power supply 300 also generates the first ground 220 (shown in FIGS. 2 and 3). For example, the DC power is generated with respect to the first ground 220 so that components using the DC power also use the first ground 220 as reference. In some example embodiments, the control electronics 22' will use the DC power and first ground 220 to operate.

The pilot signal generating circuit 200 may be incorporated in the control electronics 22' of the EVSE 20', as is shown in FIG. 4. However, it will be appreciated by those having ordinary skill in the art that the pilot signal generating circuit 200 may be disposed in other elements of the EVSE 20' without departing from the scope of the disclosed concept. The EVSE to EV system 100' with the pilot generating circuit 200 is able to generate a pilot signal and second ground 222 (shown in FIGS. 2 and 3) that are isolated from the power lines L1,L2 of the EVSE 100'.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electrical circuit for electric vehicle supply equipment, the electrical circuit comprising:
    a pilot control signal unit structured to generate a pilot control signal having a state including one of a high state and a low state;
    an isolation unit electrically connected to the pilot control signal unit and a first ground and being structured to isolate the pilot control signal to generate an isolated pilot control signal; and
    an amplification unit electrically connected to the isolation unit, having a second ground, and being structured to amplify the isolated pilot control signal to generate a pilot signal,
    wherein the isolation unit is structured to isolate the second ground of the amplification unit from the first ground.

2. The electrical circuit of claim 1, wherein the isolation unit includes a plurality of first resistors electrically connected in series between the pilot control signal unit and the amplification unit and a plurality of second resistors electrically connected in series between the system ground and the isolated system ground.

3. The electrical circuit of claim 2, wherein the plurality of first resistors have a total resistance of at least 4 MΩ.

4. The electrical circuit of claim 2, wherein the plurality of second resistors have total resistance of at least 4 MΩ.

5. The electrical circuit of claim 1, wherein the isolation unit is structured to isolate the pilot control signal and the system ground from at least a 6 kV surge voltage between power lines of the electric vehicle supply equipment.

6. The electrical circuit of claim 1, wherein the amplification unit includes a difference amplifier circuit and a inverting amplifier electrically connected in series.

7. The electrical circuit of claim 6, wherein the difference amplifier circuit is structured to output a difference between the isolated pilot control signal and the second ground.

8. The electrical circuit of claim 7, wherein the difference amplifier circuit includes an operational amplifier having a non-inverting input, an inverting input, and an output; wherein the inverting input is structured to receive the isolated pilot control signal; wherein the isolation unit is electrically connected between the first ground and the non-inverting input; and wherein the second ground is electrically coupled to the non-inverting input.

9. The electrical circuit of claim 8, wherein the inverting amplifier is structured to invert the output of the difference amplifier circuit; and wherein the inverting amplifier is structured to output the pilot signal.

10. The electrical circuit of claim 1, wherein the pilot signal has a voltage of −12V when the pilot control signal has the low state and 12V when the pilot control signal has the high state.

11. The electrical circuit of claim 1, wherein the pilot signal is a J1772 compliant pilot signal.

12. Electric vehicle supply equipment comprising:
power lines structured to carry power to charge an electric vehicle;
a power supply unit structured to generate DC power and a first ground from power received from the power lines; and
a pilot signal generating circuit structured to generate a pilot signal and including:
a pilot control signal unit structured to generate a pilot control signal having a state including one of a high state and a low state;
an isolation unit electrically connected to the pilot control signal unit and the first ground and being structured to isolate the pilot control signal to generate an isolated pilot control signal; and
an amplification unit electrically connected to the isolation unit, having a second ground, and being structured to amplify the isolated pilot control signal to generate the pilot signal,
wherein the isolation unit is structured to isolate the second ground of the amplification unit from the first ground.

13. The electric vehicle supply equipment of claim 12, wherein the isolation unit includes a plurality of first resistors electrically connected in series between the pilot control signal unit and the amplification unit and a plurality of second resistors electrically connected in series between the system ground and the isolated system ground.

14. The electric vehicle supply equipment of claim 13, wherein the plurality of first resistors have a total resistance of at least 4 MΩ.

15. The electric vehicle supply equipment of claim 13, wherein the plurality of second resistors have a total resistance of at least 4 MΩ.

16. The electric vehicle supply equipment of claim 12, wherein the isolation unit is structured to isolate the pilot control signal and the system ground from at least a 6 kV surge voltage between power lines of the electric vehicle supply equipment.

17. The electric vehicle supply equipment of claim 12, wherein the amplification unit includes a difference amplifier circuit and an inverting amplifier electrically connected in series.

18. The electric vehicle supply equipment of claim 17, wherein the difference amplifier circuit is structured to output a difference between the isolated pilot control signal and the second ground.

19. The electric vehicle supply equipment of claim 18, wherein the difference amplifier circuit includes an operational amplifier having a non-inverting input, an inverting input, and an output; wherein the inverting input is structured to receive the isolated pilot control signal; wherein the isolation unit is electrically connected between the first ground and the non-inverting input; and wherein the second ground is electrically coupled to the non-inverting input.

20. The electric vehicle supply equipment of claim 17, wherein the inverting amplifier is structured to invert the output of the difference amplifier circuit; and wherein the inverting amplifier is structured to output the pilot signal.

* * * * *